United States Patent [19]
Palmer

[11] 3,990,863
[45] Nov. 9, 1976

[54] INTEGRATED-CIRCUIT BLOCK EXTRACTION TOOL

[76] Inventor: Harold D. Palmer, 25942 Corriente Lane, Mission Viejo, Calif. 92675

[22] Filed: Oct. 20, 1975

[21] Appl. No.: 624,131

Related U.S. Application Data

[63] Continuation of Ser. No. 493,596, Aug. 1, 1974, abandoned.

[52] U.S. Cl. ............................ 29/203 B; 29/203 H; 29/278; 219/230; 228/51; 228/264
[51] Int. Cl.² .................... B23P 19/04; B25B 27/14
[58] Field of Search ........ 29/203 B, 203 H, 203 HM, 29/427, 267, 278; 228/51, 19, 264; 219/229, 230; 83/144

[56] References Cited
UNITED STATES PATENTS

| | | | |
|---|---|---|---|
| 2,853,734 | 9/1958 | Thomas | 83/144 |
| 3,230,338 | 1/1966 | Kawecki | 219/230 |
| 3,529,760 | 9/1970 | Hickman et al. | 29/203 H |
| 3,538,580 | 11/1970 | Bruner | 29/203 H |
| 3,579,795 | 5/1971 | Burman | 29/278 |
| 3,632,973 | 1/1972 | O'Keefe | 29/203 H |
| 3,699,629 | 10/1972 | Hood, Jr. et al. | 29/203 H |

*Primary Examiner*—Carl E. Hall
*Attorney, Agent, or Firm*—Nilsson, Robbins, Dalgarn & Berliner

[57] ABSTRACT

An extraction tool is disclosed for removing integrated-circuit blocks (IC's) from soldered placement in a circuit board. Support members of the tool position it with reference to the circuit board for proper operation. Heating elements melt the solder; and a force mechanism, including a pair of grippers, is then actuated. In a two-step motion pattern, the grippers grasp the block then withdraw it from the circuit board. An ejector then forces the block from the tool.

8 Claims, 5 Drawing Figures

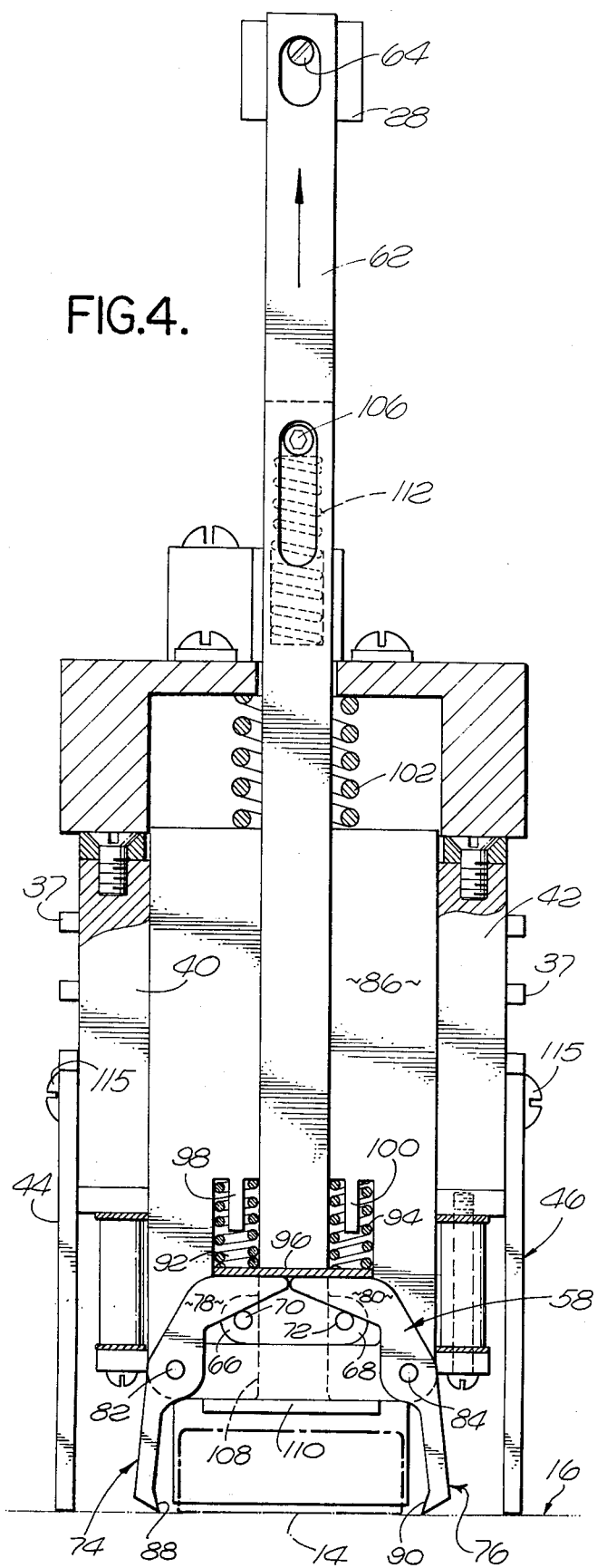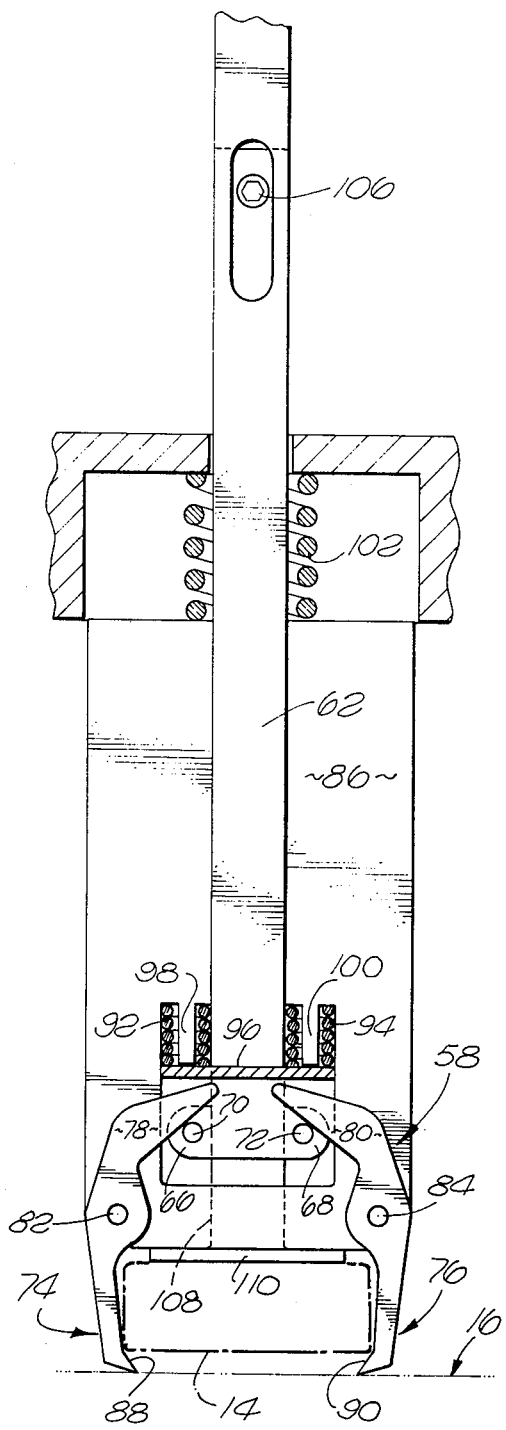

INTEGRATED-CIRCUIT BLOCK EXTRACTION TOOL

This is a continuation of application Ser. No. 493,596, filed Aug. 1, 1974, now abandoned.

BACKGROUND AND SUMMARY OF THE INVENTION

Generally, the removal of an integrated-circuit block from a printed circuit board involves heating the electrical terminals of the block to melt the solder that connects them to the board. Applying sufficient heat to melt the solder without damaging the board has traditionally been a rather critical operation. One technique that has been frequently used in the past involves heating the solder only to a temperature at which it is weakened, then grasping the block to wiggle and pry it loose from the circuit board. Such a procedure tends to damage the circuit board by cracking it. Also, heat damage to the board continues to be somewhat of a problem even though the solder is heated only to a limited temperature. Consequently, a need has existed for an effective and economical tool for removing integrated-circuit blocks from circuit boards simply and without damaging the boards.

The present invention provides an extraction tool for integrated-circuit blocks, which tool can be positioned directly over a block and functions to first melt the solder releasing the block, then operate to withdraw the block from the board along an axis perpendicular to the circuit board. An ejector is incorporated in the tool for discharging a circuit block which has been removed.

BRIEF DESCRIPTION OF THE DRAWINGS

FIG. 4 is a sectioned top plan view of the tool of FIG. 1, illustrating the tool in one operating configuration; and FIG. 5 is a sectioned top plan view of a portion of the extraction tool of FIG. 1 illustrating the tool in another operating configuration.

DESCRIPTION OF THE PREFERRED EMBODIMENTS

Figure 1:
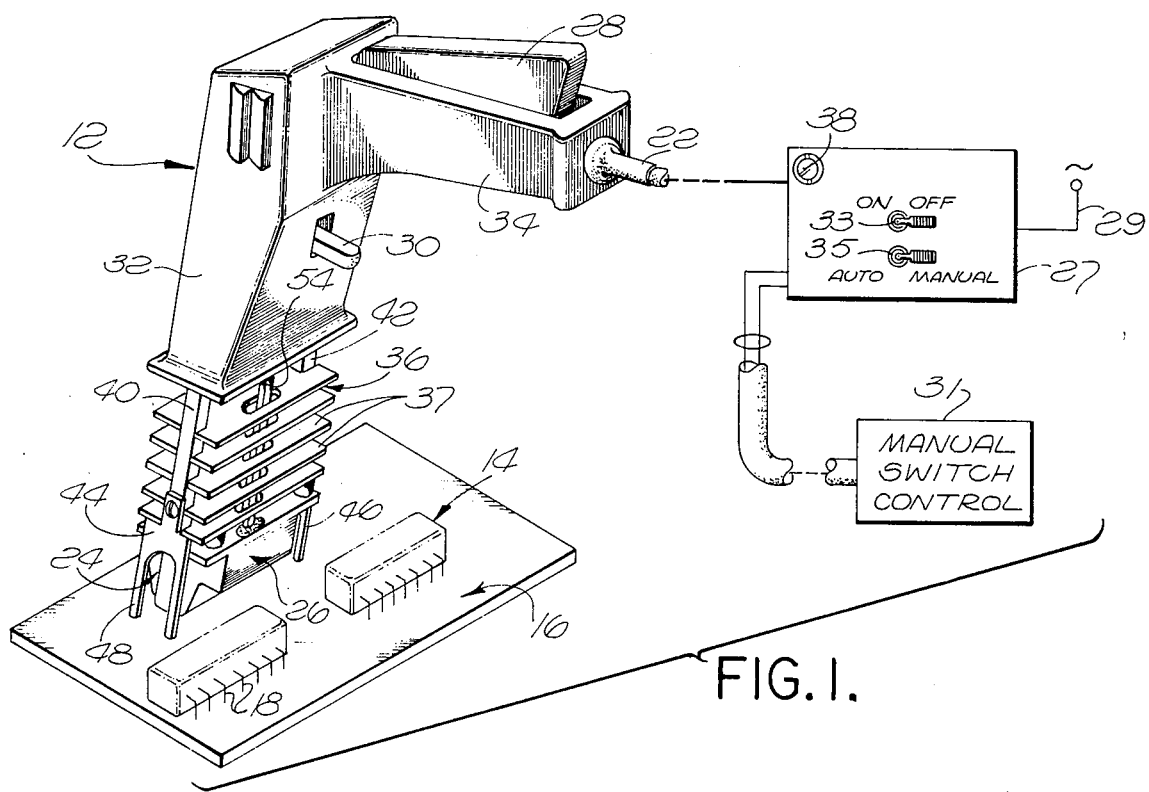
FIG. 1 is a perspective and diagrammatic view of an extraction tool in accordance herewith, shown adjacent a printed circuit board carrying integrated-circuit blocks.

Referring initially to FIG. 1, there is shown an integrated-circuit block extraction tool 12 poised above a block 14 to be extracted from a printed circuit board 16. In accordance with convention, the block 14 is mounted on the surface of the board 16 with terminals 18 extending in two rows from each side of the block 14, through the board 16 to the opposed surface for solder connection.

Considering the operation of the tool 12 generally, it is positioned over the integrated-circuit block 14 to engage the terminals 18 in heat-transfer relationship. Consequently, the solder connections are melted, after which the tool is actuated manually to accomplish a complex motion pattern that withdraws the block 14 from the board 16. In that regard, the tool first clamps the block 14 across its ends while lifting the block slightly, after which the block is lifted perpendicularly to clear the board 16.

Upon positioning the tool 12 over the block 14, the unit is energized to a heated state as described in detail below. Consequently, a pair of heater elements 24 and 26 are energized to conductively heat the terminals 18 and melt the solder fixing such terminals to the board 16. Next, the operator actuates a force mechanism (described below) of the tool 12 by forcefully gripping a handle lever 28. That action causes the tool 12 to grip the block 14 and draw it from the board 16. After clearing the board 16, the operator may lift the tool and actuate a trigger 30 to eject the withdrawn block 14 from the tool 12.

The electrical apparatus for energizing the tool 12 through a cable 22 includes a control box 27 energized by a line 29 and which may be operated either automatically or under manual control by a switch 31. An "on-off" switch 33 is provided on the control box 27 along with a mode-select switch 35 and an electrical-current indicating lamp 38. With the mode-select switch 35 set to "automatic", the control box 27 operates to maintain the tool 12 at operating temperature. Alternatively, to accommodate less-frequent use, the mode-select switch is set to "manual" whereby the tool 12 is energized under control of a momentary-contact switch 31 which may be embodied as a foot switch. Such control units and circuits are known in the electrical arts and accordingly are not described in further detail herein.

Structurally, the tool 12 includes a pistol-shaped section defined by a housing 32, incorporating a grip 34 from which the lever 28 extends. At the opposite end of the housing 32, a heat-sink structure 36 is provided for dissipating heat developed by the heater elements 24 and 26 and maintaining the housing 32 relatively cool. A force mechanism (not shown in FIG. 1) operates between the heater elements 24 and 26 to engage and extract the block 14 upon its release.

Considering the elements of the tool 12 in somewhat greater detail, the housing 32 may be formed of plastic as by molding, and is embodied somewhat in a gun configuration to support the heater elements 24 and 26 at the operating end. Terminal connections for the cable 22 are provided in the handle 34 of the housing 32.

At the operating end of the housing 32 (remote from the grip 34) a heat-sink structure (radiator) includes a set of spaced-apart, stack-aligned plates 37 which are supported on a pair of parallel columns 40 and 42 extending from opposite sides of the housing 32. Aligned with the columns 40 and 42 are a pair of support structures or spacers 44 and 46, respectively, the tips of which engage the board 16 to position the tool 12 while a block is being removed. Physically, the spacers 44 and 46 are of U-shaped configuration so that each comprises a pair of extensions or legs 48 which are solidly mounted to extend from the tool 12. The tips of the legs 48 extend a slight distance beyond the heater elements 24 and 26 so as to avoid contact by either heater element with the board 16.

Figure 3:
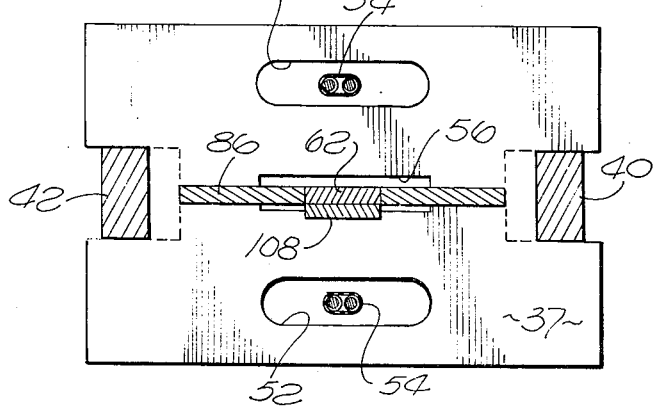
FIG. 3 is a sectional view taken along line 3—3 of FIG. 2.

The heat-radiating plates 37 (FIG. 3) are of rectangular configuration and may comprise various alloys for effectively radiating heat. The plates 37 define apertures 50 and 52 for accommodating wires 54 for energizing the heater elements 24 and 26 (FIG. 1). Additionally, the plates 37 define a central passage 56

(FIG. 4) containing the sliding members (considered below) for actuating the force mechanism.

Considering the structure of the force or withdrawing mechanism, reference will now be made somewhat concurrently to FIGS. 2, 4 and 5. The mechanism is generally indicated by the numeral 58 (FIG. 2) and is actuated, as indicated above, by the grip lever 28. Specifically, the lever 28 is pivotally supported (inside the housing 32) by a pin 60 so as to develop a rearward motion by a slider 62 to which the lever 28 is connected by a stud 64. The elongated slider 62 (FIG. 4) extends from the lever 28 to a forward terminal end terminating in a pair of ears 66 and 68 (lower central, FIG. 4). A pair of transversely extending cam pins 70 and 72 are affixed normal to the ears 66 and 68, respectively, for actuating opposed jaws 74 and 76 of the force mechanism 58. Specifically, the pins 70 and 72 engage legs 78 and 80, respectively, for cam actuating the jaws 74 and 76 which are pivotally mounted by pins 82 and 84, respectively, on a slide plate 86. Recapitulating to some extent, upon upward motion of the slider 62, the pins 70 and 72 engage the tapered surfaces of the legs 78 and 80, respectively, lifting those members (FIG. 5) so that the forward ends of the jaws 74 and 76 move inwardly with the result that the pointed tips 88 and 90 will move under the block 14 camming it from the board 16.

The clamping action of the jaws 74 and 76 as described above is resisted by a pair of coil springs 92 and 94 (FIG. 4) which abut a force plate 96 and are positioned by extensions 98 and 100 from the slide plate 86. Consequently, the jaws 74 and 76 are spring biased to a forward and open configuration.

When the jaws 74 and 76 (FIG. 5) are closed to the limited extent of their travel, forces are applied through the pins 82 and 84 to the slide plate 86. A coil spring 102 is provided above the slide plate 86 around the slider 62 which is coplanar with the slide plate 86. It is to be noted that the slide plate 86 is of a U-shaped configuration (open at the upper end) with the slider 62 operating in the central opening. Consequently, as the slider 62 (FIG. 5) is raised from the position indicated, the slide plate 86 is raised (by forces acting through the jaws 74 and 76) to lift the jaws 74 and 76 perpendicular to the board 16 thereby withdrawing the block 14.

Upon the removal of the block 14 from the board 16, the lever 28 (FIG. 2) may be released permitting the springs 92 and 94 to spread the jaws 74 and 76 and concurrently permitting the spring 102 to move the force mechanism downwardly with respect to the body of the tool. As the tool is lifted from the board 16 (as with the force mechanism returned to the quiescent configuration) the block 14 remains in the tool 12 as the heater elements 24 and 26 maintain contact with the block 14 at the terminals 18. As suggested above, the tool 12 includes apparatus for ejection of the block 14 from the tool as will now be considered in detail.

Figure 2:
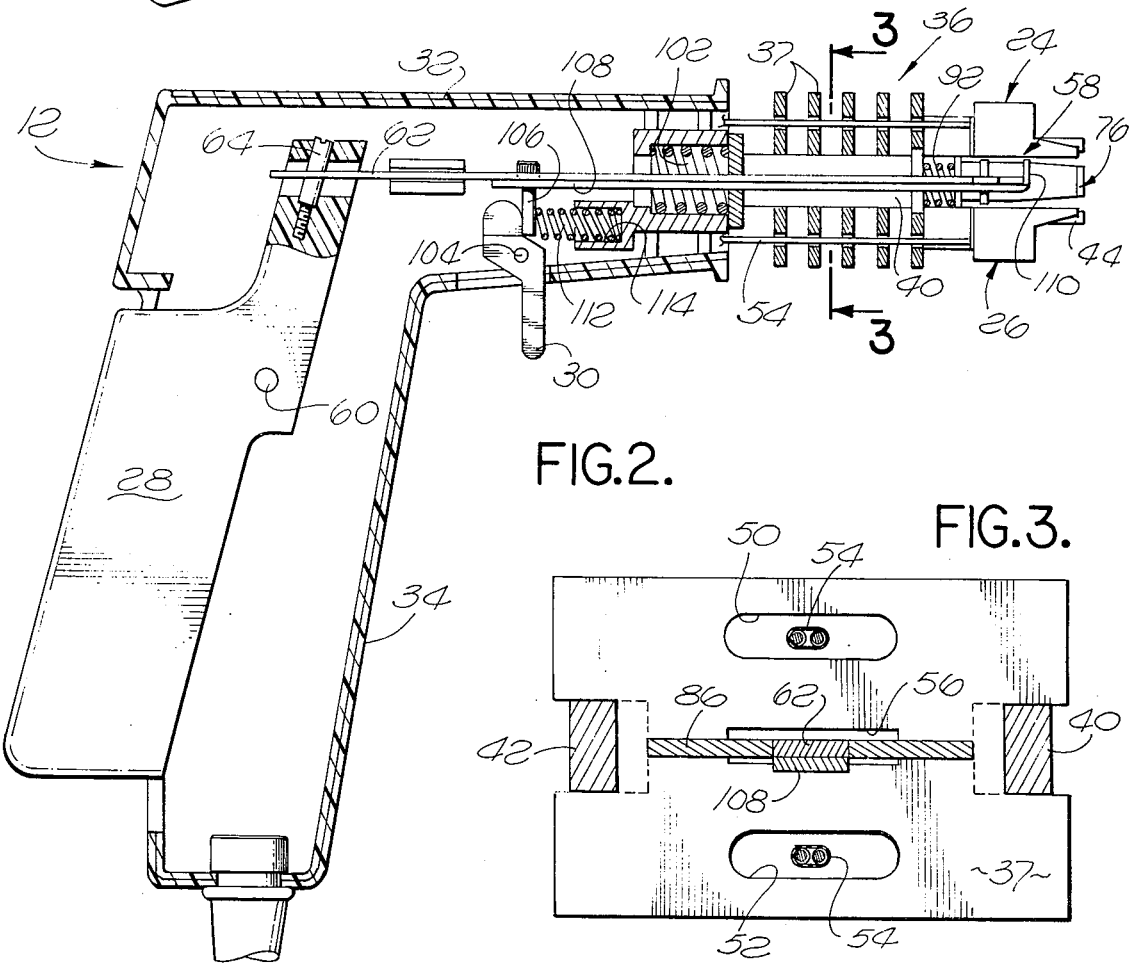
FIG. 2 is a sectional side elevation view of the extraction tool of FIG. 1.

Referring to FIG. 2, the trigger 30 is supported on a pin 104 for pivotal motion to engage a stud 106 which is slidably supported through the slider 62 and fixed to an ejector slide 108. The ejector slide extends through the housing 32 and the heat-sink structure 36 contiguous to the slider 62, terminating in the force mechanism 58 at a perpendicular extension 110. The slide 108 is biased rearwardly (to the left) by spring 112 which is fixed between a bore 114 in the housing 32 and the stud 106. The operation of the ejector is relatively direct and upon pulling the trigger 30, the spring 112 is compressed while the stud 106 and the slide 108 move forward (right) with the result that the flat extension 110 moves through the space defined between the heater elements and ejects a block 14 from such location.

It will be apparent to those skilled in the art that the extraction tool may be variously constructed depending upon interests of economy, maintenance and operating characteristics. However, one mode of construction involves forming the housing 32 of plastic, using injection-molding techniques to provide mating halves. The lever 28 as well as the trigger 30 may also be formed of plastic components again by utilizing injection-molding techniques.

The nature of the housing 32 is somewhat related to the heat-sink structure 36. That is, the heat-sink structure serves to reduce temperatures in and about the housing 32. By providing an effective structure 36, the housing 32 may be formed of materials having relatively low temperature tolerance.

As indicated above, the heat-sink structure may comprise a series of similar metallic radiating plates 38; however, alternatively, rather than stampings, a casting or other structures may be employed.

Other subcomponents which merit comment include the heater elements 24 and 26. In one operating embodiment, these elements have been machined of high-temperature tolerant metal defining an internal space into which a resistance wire is affixed. Generally, it is significant that the heater elements 24 and 26 are relatively rigid to contact the somewhat-flexible terminals 18 of blocks 14 and further that the elements 24 and 26 possess reasonably good heat-transfer characteristics.

Components as the sliding units including the jaws 74 and 76 may be variously formed utilizing existing metal-shaping techniques, e.g. stamping, cutting and so on. In that regard, the spacers 44 and 46 (FIG. 1) might be provided in any of a variety of forms to accommodate different specific applications of the tool.

Assembly of the unit will be readily apparent to one skilled in the art. Generally, the structure is simply fitted together by the use of threaded fasteners and in some instances press-fit pins.

In using the tool, a desirable pair of spacers, e.g. spacers 44 and 46 are affixed to the heat-sink structure 36 by studs 115. Thereafter, as a preliminary operation, the cable 22 is connected to a source of electrical energy compatible with the heater elements 24 and 26. At that stage the tool is ready for use.

The detailed operation of the tool simply involves poising it above a block 14 (FIG. 1) which is to be removed. Of course, the determination to remove the block 14 may be based upon a desire for replacement or simply part of a dismantling operation. In any event, as indicated above, it is generally desirable to accomplish such removal without harm to the circuit board 16. Upon lowering the tool 12 over the block 14, the block is received with its sides engaging the heater elements 24 and 26 (FIG. 2), and its ends facing the jaws 74 and 76. With the tool in such a position, the operator actuates the lever 28 (FIG. 1) drawing the slider 62 (FIG. 4) upward with the result that the jaws 74 and 76 (FIG. 5) close upon the block 14. In the course of such action, the tips 88 and 90 of the jaws 74 and 76 cam the block out of the board 16. With that initial motion pattern completed, the continued movement of the slider 62 moves the jaws 74 and 76 along with the slide plate 86 upwardly to complete the withdrawal of the block 14.

As indicated above, upon completion of the withdrawal operation, the block 14 may be simply and easily removed from the tool merely by pulling the trigger 30. That operation actuates the slide 108 (FIG. 2) with the result that the extension 110 moves through the space between the heater elements 24 and 26 clearing that space of the block 14. Thus, integrated-circuit blocks may be simply and easily removed leaving circuit boards undamaged, and substantially clear of solder, for the insertion of another block.

Recognizing, as indicated above, that the structure may be variously implemented, it is generally significant that elements be provided for transferring heat to effectively melt fixing solder and that in a single stroke clamping and withdrawal be accomplished. Of course, economy of structure and simplicity of operation are also quite significant. Accordingly, recognizing various possibilities for specific details, the scope hereof shall be as set forth in the following claims.

What is claimed is:

1. An extraction tool for removing an integrated-circuit block having terminals soldered to a printed circuit board comprising:
    a tool body incorporating a grip handle and means for applying force;
    engaging means having jaws movably mounted with respect to said tool body means, for grasping said integrated circuit block and lifting said block from said board;
    actuation means affixed to said tool body and coupled to said means for applying force, for actuating said engaging means;
    heater means affixed to said tool body and spaced apart from said engaging means, said heater means for applying heat to said terminals of said block on the side of said printed circuit board where said circuit block is mounted; and
    stacked-plate radiator means affixed between said heater means and said tool body for maintaining said body relatively cool.

2. An extraction tool according to claim 1 wherein said actuation means includes means for initially moving said jaws to a first position for gripping said block and subsequently to a second position for withdrawing said block from said board.

3. An extraction tool for removing an integrated-circuit block having terminals soldered to a printed circuit board comprising:
    a tool body incorporating a grip handle and means for applying force;
    reference means affixed to said tool body for engaging said printed circuit board to position said tool body in a reference position substantially above said circuit block;
    engaging means having jaws movably mounted with respect to said reference means, for grasping said integrated circuit block and lifting said block from said board;
    actuation means affixed to said tool body for actuating said engaging means;
    heater means for applying heat to said terminals of said block on the side of said printed circuit board where said circuit block is mounted; and
    a stacked-plate radiator means affixed between said heater means and said tool body for maintaining said body relatively cool.

4. An extraction tool for removing an integrated-circuit block having terminals soldered to a printed circuit board comprising:
    a tool body incorporating a grip handle, manual gripping means and manual trigger means for applying force relative to said tool body;
    reference means affixed to said tool body for positioning said tool body above said circuit block;
    engaging means having jaws movably mounted with respect to said reference means, for grasping said integrated circuit block;
    actuation means affixed to said tool body and coupled for motivation by said manual gripping means, to initially actuate said engaging means to move said jaws to a first position for gripping said block and subsequently to actuate said engaging means to a second position, withdrawing said block from said board;
    heater means affixed to said tool body and spaced apart from said engaging means, said heater means for applying heat to said terminals of said block on the side of said printed circuit board where said circuit block is mounted; and
    ejection means movably mounted with reference to said tool body for clearing a circuit block from said space defined to receive said circuit block, said ejection means coupled for actuation by said trigger means.

5. An extraction tool according to claim 3 wherein said reference means comprise extension legs affixed to said tool body and spaced apart from said heater means.

6. An extraction tool according to claim 3 wherein said heater means comprises resistance-wire heated element means fixed to said tool body and defining a space to receive said circuit block.

7. An extraction tool according to claim 4 further including spring means for providing a force opposed to forces applied by said actuation means and said ejection means.

8. An extraction tool according to claim 4 wherein said actuation means is manually operated to lift said block.

* * * * *